(12) United States Patent
Weikel et al.

(10) Patent No.: US 7,298,134 B2
(45) Date of Patent: Nov. 20, 2007

(54) ELECTRICAL-ENERGY METER ADAPTABLE FOR OPTICAL COMMUNICATION WITH VARIOUS EXTERNAL DEVICES

(75) Inventors: Scott J. Weikel, Raleigh, NC (US); Lars A. Lindqvist, Nyköping (SE)

(73) Assignee: Elster Electricity, LLC, Raleigh, NC (US)

( * ) Notice: Subject to any disclaimer, the term of this patent is extended or adjusted under 35 U.S.C. 154(b) by 270 days.

(21) Appl. No.: 10/962,925

(22) Filed: Oct. 12, 2004

(65) Prior Publication Data

US 2006/0076944 A1    Apr. 13, 2006

(51) Int. Cl.
*G01R 7/00* (2006.01)

(52) U.S. Cl. .................. 324/142; 324/96; 340/870.02; 340/870.03

(58) Field of Classification Search ............. 702/61; 379/106.03
See application file for complete search history.

(56) References Cited

U.S. PATENT DOCUMENTS

| | | | |
|---|---|---|---|
| 3,380,064 A * | 4/1968 | Norris et al. ............... 346/17 |
| 4,298,839 A * | 11/1981 | Johnston ..................... 324/156 |
| 4,491,789 A * | 1/1985 | Benbow ...................... 324/113 |
| 4,959,607 A * | 9/1990 | Coryea et al. ............ 324/103 R |
| 5,057,767 A * | 10/1991 | Keturakis et al. ............ 324/96 |
| 5,270,639 A * | 12/1993 | Moore .......................... 324/42 |
| 5,296,803 A * | 3/1994 | Kirby et al. ................. 324/156 |
| 5,861,742 A * | 1/1999 | Miller et al. ................ 324/156 |
| 6,008,711 A * | 12/1999 | Bolam ......................... 336/92 |
| 6,213,651 B1 * | 4/2001 | Jiang et al. .................... 385/92 |
| 6,316,932 B1 * | 11/2001 | Horan et al. ................. 324/156 |
| 6,737,855 B2 * | 5/2004 | Huber et al. ................ 324/156 |
| 6,999,215 B2 * | 2/2006 | Dewa et al. ................. 359/198 |
| 6,999,567 B2 * | 2/2006 | Crichlow ............... 379/106.06 |
| 2002/0084914 A1 * | 7/2002 | Jackson et al. ......... 340/870.02 |
| 2003/0184448 A1 * | 10/2003 | Kagan .................. 340/870.28 |
| 2005/0027464 A1 * | 2/2005 | Jonker et al. ................. 702/61 |

* cited by examiner

*Primary Examiner*—Ha Tran Nguyen
*Assistant Examiner*—Richard Isla-Rodas
(74) *Attorney, Agent, or Firm*—Woodcock Washburn LLP

(57) ABSTRACT

An example embodiment of an electrical-energy meter comprises a transformer for producing an electrical output proportional to an electrical current in a conductor of electrical energy, a circuit board electrically coupled to the transformer for facilitating the calculation and displaying of a cumulative amount of electrical energy passing through the conductor of electrical energy, a first optical transmitter, a second optical transmitter, and an optical receiver. The first and second optical transmitters and the optical receiver are coupled to the circuit board. The first optical transmitter and the receiver facilitate optical communications between the electrical-energy meter and a first type of external device. The second optical transmitter and the receiver facilitate optical communications between the electrical-energy meter and a second type of external device.

15 Claims, 14 Drawing Sheets

ELECTRICAL-ENERGY METER ADAPTABLE FOR OPTICAL COMMUNICATION WITH VARIOUS EXTERNAL DEVICES

FIELD OF THE INVENTION

The present invention relates to electrical-energy meters, also referred to as "watt-hour meters" or "power meters," for measuring consumption of electrical power. More particularly, the invention relates to optical communications between electrical-energy meters and external devices.

BACKGROUND OF THE INVENTION

The reading of electrical-energy meters has historically been accomplished with human meter readers who visit a customer's premises and manually document relevant information from the meter. Such readings have usually been limited to information regarding the electrical consumption of the customer. Over time, manual meter reading has been enhanced or eliminated through the use of meter reading systems. In one example of a meter reading system, a probe is held in proximity to and communicates with the meter. The communication between the probe and the meter is two way and involves an exchange of information beyond just the electrical consumption of the consumer. Today, for example, diagnostic information can be communicated by the meter reading system.

Information between an electrical-energy meter and a probe or other external device may be exchanged by two-way, optically isolated communications. In such cases, the electrical-energy meter will have an optical port with an optical transmitter and an optical receiver that communicate with the external device through a respective optical receiver and optical transmitter of the external device.

Various styles of optical ports have been developed for electrical-energy meters. One style was developed in North America in conformity with the American National Standards Institute (ANSI). Another style was developed in Europe in conformity with the International Electrotechnical Commission (IEC).

The ANSI optical port and the IEC optical port differ in a few significant ways. First, the transmitter and receiver on an ANSI optical port are positioned in an opposite manner from the transmitter and receiver on an IEC optical port. In particular, when facing an ANSI optical port on an electrical-energy meter, the transmit channel is on the right and the receive channel is on the left. When facing an IEC optical port, by contrast, the transmit channel is on the left and the receive channel is on the right. A second significant way in which ANSI and IEC optical ports differ is the mechanical interface between the electrical-energy meter and the external device. For example, though not required under IEC, an IEC optical port commonly may have a number of small posts that are used to help align and hold a probe of the external device in place for the communication exchange. A typical ANSI optical port does not have such posts. An ANSI optical port, however, has a "D" shape and protrudes from the face of the meter whereas an IEC optical port is generally flush with the cover of the meter.

Electrical-energy meter manufacturers have produced meter designs corresponding to the industry standard prevalent to the particular geographical area. This has led to the production and distribution of external devices configured to correspond to the electrical-energy meters. For example, in North America, external devices are configured to correspond to ANSI electrical-energy meters. In Europe, external devices are configured to correspond to IEC electrical-energy meters.

As manufacturers desire to increase market share while selling a single electric-energy meter design throughout the world, there is a need to provide a single electrical-energy meter design such that the meter is able to communicate with external devices constructed in accordance with various industry standards, such as ANSI and IEC.

SUMMARY OF THE INVENTION

In one embodiment, the invention is an electrical-energy meter, comprising a base for mounting the meter, a transformer mechanically coupled to the base for producing an electrical output proportional to an electrical current in a conductor of electrical energy, a circuit board electrically coupled to the transformer for calculating and displaying a cumulative amount of electrical energy passing through the conductor of electrical energy, a first and second optical transmitter and an optical receiver electrically coupled to the circuit board, wherein the first optical transmitter and the receiver facilitate optical communications between the electrical-energy meter and a first type of external device, and wherein the second optical transmitter and the receiver facilitate optical communications between the electrical-energy meter and a second type of external device. The first type of device may be constructed in accordance with the standard ANSI C12.10-1997 published by the American National Standards Institute, and the second type of device may be constructed in accordance with the standard IEC 62056-21 (2002) published by the International Electrotechnical Commission.

In an alternative embodiment, the electrical-energy meter may comprise a base for mounting the electrical-energy meter, a transformer mechanically coupled to the base for producing an electrical output proportional to an electrical current in a conductor of electrical energy, a circuit board electrically coupled to the transformer for calculating and displaying a cumulative amount of electrical energy passing through the conductor of electrical energy, and a first and a second optical receiver and an optical transmitter electrically coupled to the circuit board, wherein the first optical receiver and the transmitter facilitate optical communications between the electrical-energy meter and a first type of external device, and wherein the second optical receiver and the transmitter facilitate optical communications between the electrical-energy meter and a second type of external device.

In a further embodiment, a template for a cover for an electrical-energy meter may comprise a base having a first and a second through hole, wherein the first through hole may substantially align with a first optical transmitter of an electrical-energy meter, the second through hole may substantially align with an optical receiver of the electrical-energy meter, and the template base covers a second optical transmitter of the electrical-energy meter when the template base is attached to the cover.

In an alternative embodiment, a cover system for an electrical-energy meter may comprise a cover for attaching to the meter, the cover allowing optical access to a first and a second optical transmitter and to a receiver from a position external to the meter, a template which comprises a base having a first and a second through hole formed therein, wherein the first through hole substantially aligns with one of the first and second optical transmitters of the meter, the second through hole substantially aligns with the optical receiver of the meter, and the base covers the other of the first and second optical transmitters when the template is attached to the cover.

In an alternative embodiment, a cover for an electrical-energy meter may comprise a first optical conduit, a second optical conduit in optical communication with the first optical conduit, and a third optical conduit, wherein the cover is capable of being attached to an electrical-energy meter, and wherein the cover is capable of receiving at least one of a first template for configuring the electrical-energy meter to communicate optically with a first type of external device and a second template for configuring the meter to communicate optically with a second type of external device.

The invention may also include a method of configuring an electrical-energy meter for communication with an external device, comprising selecting an electrical-energy meter comprising two optical transmitters, and one receiver, wherein the meter is capable of being configured to communicate with an external device, selecting a preconfigured template that covers one of the transmitters when the template is attached to the electrical-energy meter so that the other of the transmitters and the receiver facilitate optical communications between the electrical-energy meter and external device, and attaching the selected template to the electrical-energy meter so that the template's through holes are substantially aligned, respectively, with the electrical-energy meter's optical receiver and one of the electrical-energy meter's optical transmitters, and so that the electrical-energy meter's optical transmitter that is not substantially aligned with a template through-hole is blocked or covered-over by the template.

BRIEF DESCRIPTION OF THE DRAWINGS

The foregoing summary, as well as the following detailed description of example embodiments, is better understood when read in conjunction with the appended drawings. The invention is not limited, however, to the specific instrumentalities disclosed in the drawings. In the drawings.

DETAILED DESCRIPTION OF ILLUSTRATIVE EMBODIMENTS

Figure 1:
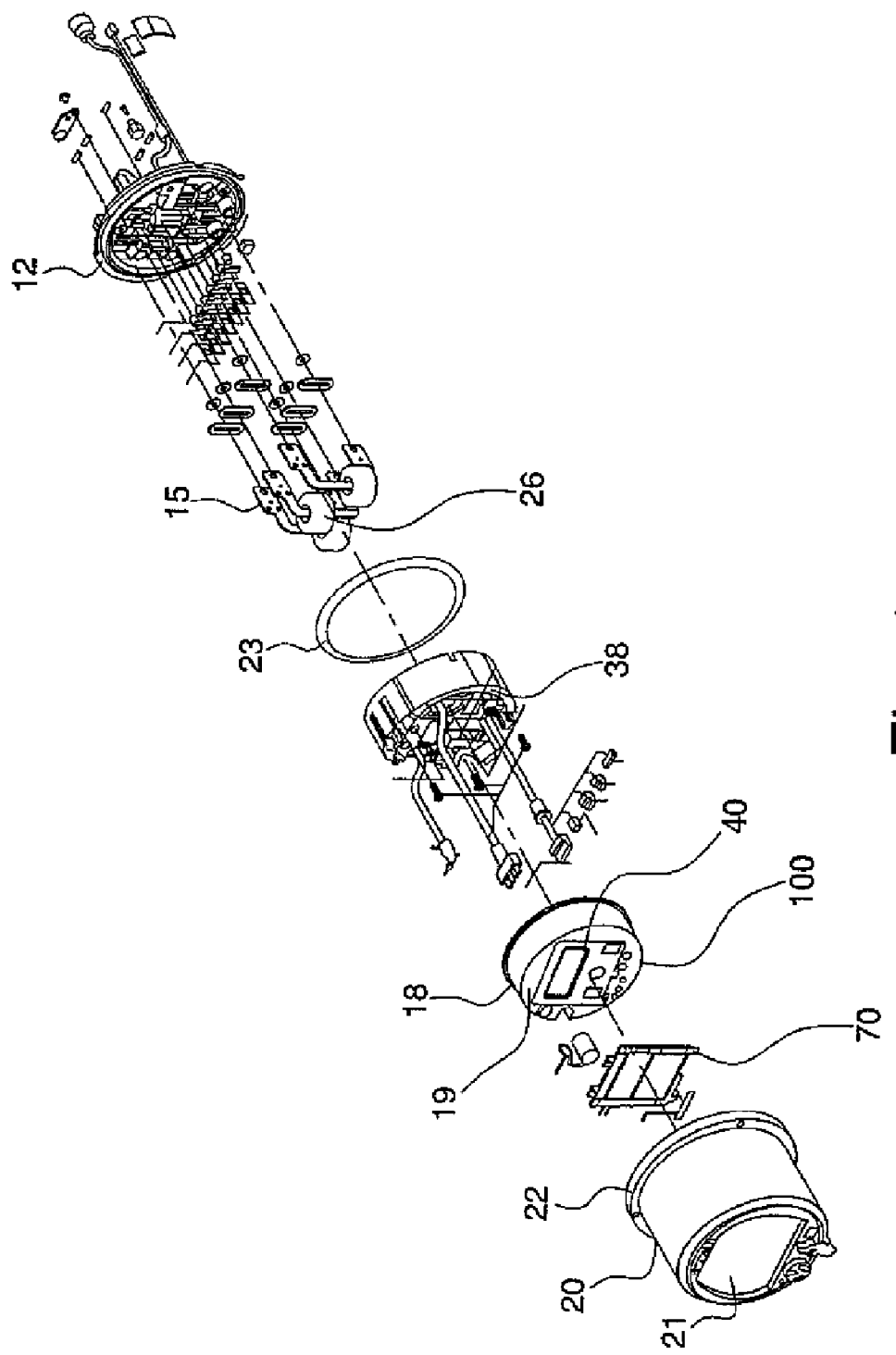
FIG. 1 is an exploded, top perspective view of an example embodiment of an electrical-energy meter.

An example embodiment of an electrical-energy meter 10 is depicted in FIGS. 1-7. The electrical-energy meter 10 is described in detail for example purposes only, as the various features of the present invention can be incorporated into other types of electrical-energy meters.

The electrical-energy meter 10 comprises a cover 20 and optical templates 200, 300. (See FIGS. 4 and 6). Cover 20 as well as optical templates 200, 300 can be used in conjunction with virtually any type of electrical-energy meter, including electrical-energy meters of the electromechanical type. Additionally, electrical-energy meter 10 is a round shape consistent with electrical-energy meters constructed in accordance with ANSI. The invention, however, is not limited to such electrical-energy meters and may be used with electrical-energy meters constructed in accordance with other industry standards as well.

Electrical-energy meter 10 comprises a base 12, a current sensor assembly 15, a current transformer 26, a circuit board 38, an inner housing 18, an optical port 100, and a cover 20. (See FIG. 1).

Base 12 is preferably molded from a reinforced thermoplastic material having the requisite mechanical, electrical, and thermal properties, flammability rating, UV stabilization, and resistance to common solvents such as insecticides and cleaning solutions. An example of such thermoplastic material is polyketone, polycarbonate, or polybutylene terephthalate.

Current sensor assembly 15 and the current transformer 26 can be mounted or coupled either directly or indirectly on base 12. Alternatively, electrical-energy meter 10 may use other current sensing techniques such as a shunt, a linear coupler (e.g., a Rogowski coil), a sensor to multiply voltage times a magnetic field (e.g., a Hall effect sensor), or a magnetic field sensor including an optical and semiconductor sensor. A circuit board 38 can be electrically coupled to current transformer 26. Circuit board 38 also receives an input or line voltage, i.e., a voltage corresponding to the voltage in the electrical-energy line (not depicted) to which electrical-energy meter 10 is connected. Circuit board 38 is adapted to calculate the total (cumulative) watt-hours of power that have passed through electrical-energy meter 10 over time based on the current and voltage input, using techniques and components commonly known to those skilled in the field of electrical-energy meter design. Circuit board 38 continually updates the cumulative watt-hours, and may be displayed on an LCD 40, which is mounted on inner housing.

Inner housing 18 is preferably molded from a reinforced thermoplastic material such as polyketone, polycarbonate, or polybutylene terephthalate and includes a substantially flat front face 19. Front face 19 of inner housing 18 includes LCD 40 and a nameplate holder 70. Nameplate holder 70 is located below LCD 40 on front face 19.

Cover 20 has a substantially transparent end 21 that provides visual access to LCD 40. Cover 20 includes a flange portion 22. A gasket 23 is positioned between flange portion 22 and base 12 to substantially seal the interface between cover 20 and base 12.

Further details relating to electrical-energy meter 10 (other than optical port 100 and cover 20) are not necessary for an understanding of the invention, and therefore are not presented herein.

Optical port 100 may be formed on front face 19 of inner cover 18 and may be optically coupled to circuit board 38. Optical port 100 facilitates optical communication between electrical-energy meter 10 and external devices (not shown). The term "external device" as used throughout the specification and claims means a device located outside of the electrical-energy meter with which the electrical-energy meter communicates. Optical port 100 enables service personnel to read, test, and calibrate electrical-energy meter 10 without removing inner housing 18 or cover 20 and without exposing service personnel to high voltages within electrical-energy meter 10. As discussed below, although optical port 100 is shown configured to allow electrical-energy meter 10 to communicate with external devices constructed in accordance with ANSI, optical port 100 can also be configured to enable electrical-energy meter 10 to communicate with other types of external devices.

Figure 2:
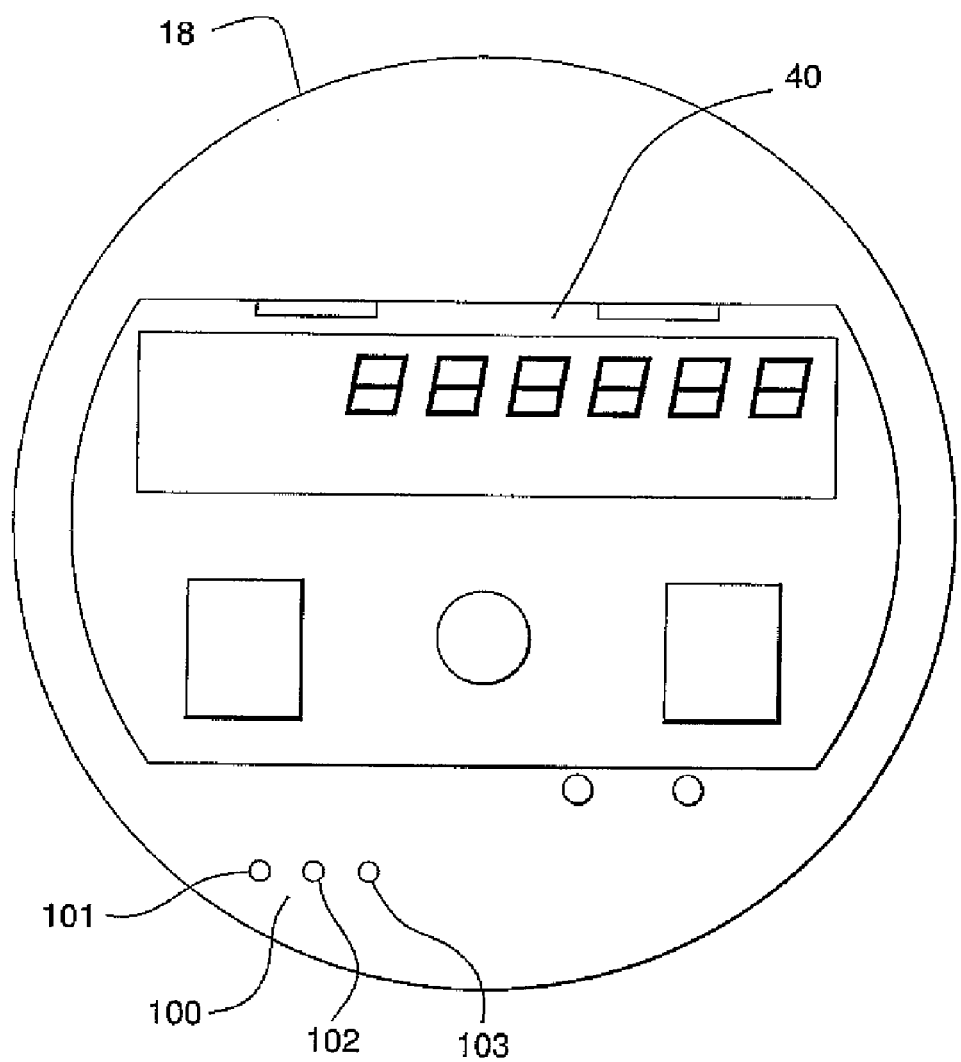
FIG. 2 is a front-perspective view of an inner cover for the electrical-energy meter shown in FIG. 1.

FIG. 2 depicts an example embodiment of inner cover 18 and, in particular, optical port 100. Optical port 100 is shown on inner cover 18, along LCD 40 but without nameplate holder 70 attached. Optical port 100 includes an optical receiver 102 located in between two optical transmitters 101 and 103.

The relative locations of optical receiver 102 and optical transmitters 101 and 103 form a port that enables electrical-energy meter 10 to communicate with external devices (not shown) that are constructed in accordance with ANSI, International Electrotechnical Commission (IEC), and other industry standards. For example, for compatibility with external devices constructed in accordance with ANSI, transmitter 103 is located to the right of receiver 102 consistent with prior art electrical-energy meters constructed with optical ports capable of communicating with external devices constructed in accordance with ANSI. Also for example, transmitter 101 is located to the left of receiver 102 consistent with prior art electrical-energy meters constructed with optical ports capable of communicating with external devices constructed in accordance with IEC.

Figure 2A:
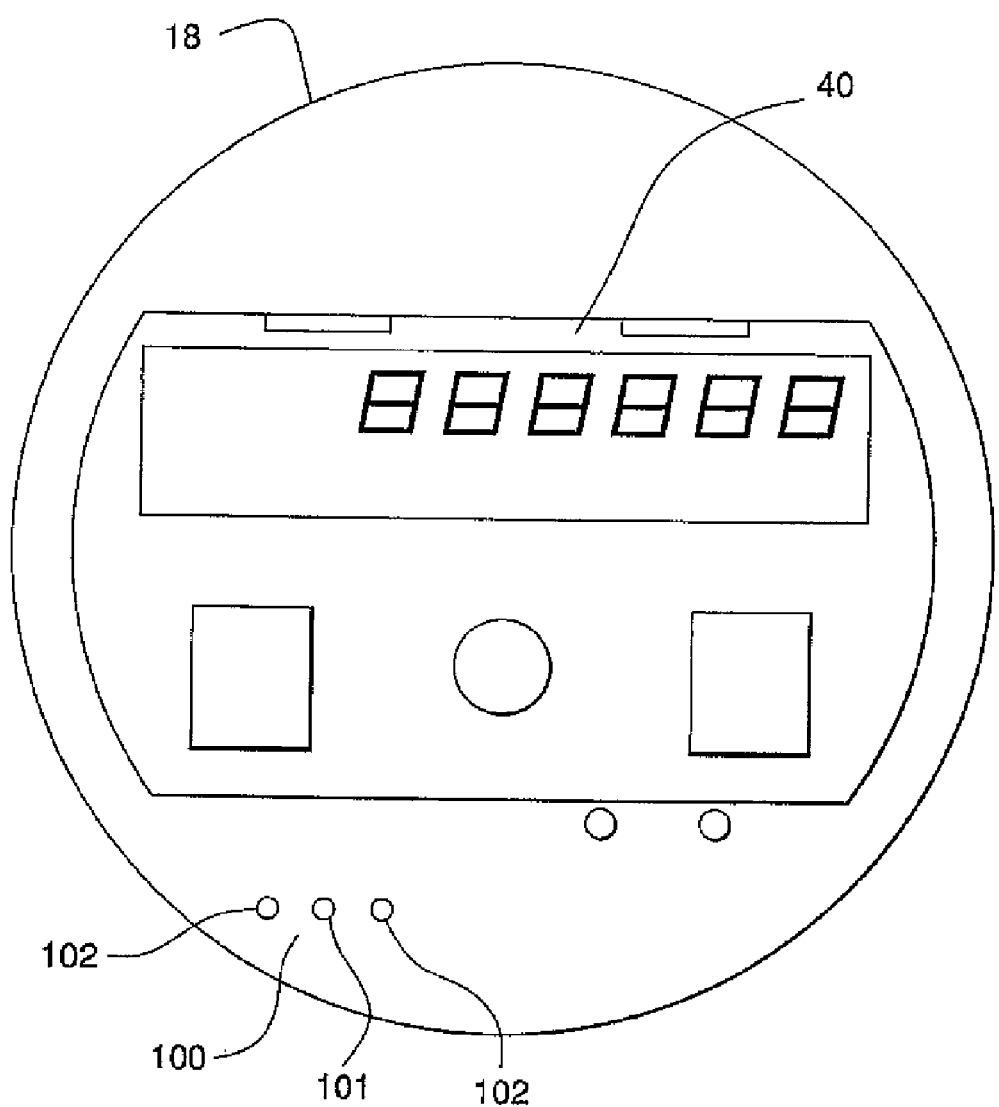
FIG. 2A is a front-perspective view of an alternative embodiment of an inner cover for an electrical energy meter.

As shown in FIG. 2A, it should be noted that optical port 100 can alternatively be constructed to include a transmitter 101 located between two receivers 102. Because transmitters are generally less expensive than receivers and are easier to use (from a circuitry point of view), the preferred embodiment is equipped with two transmitters and one receiver.

Figure 3:
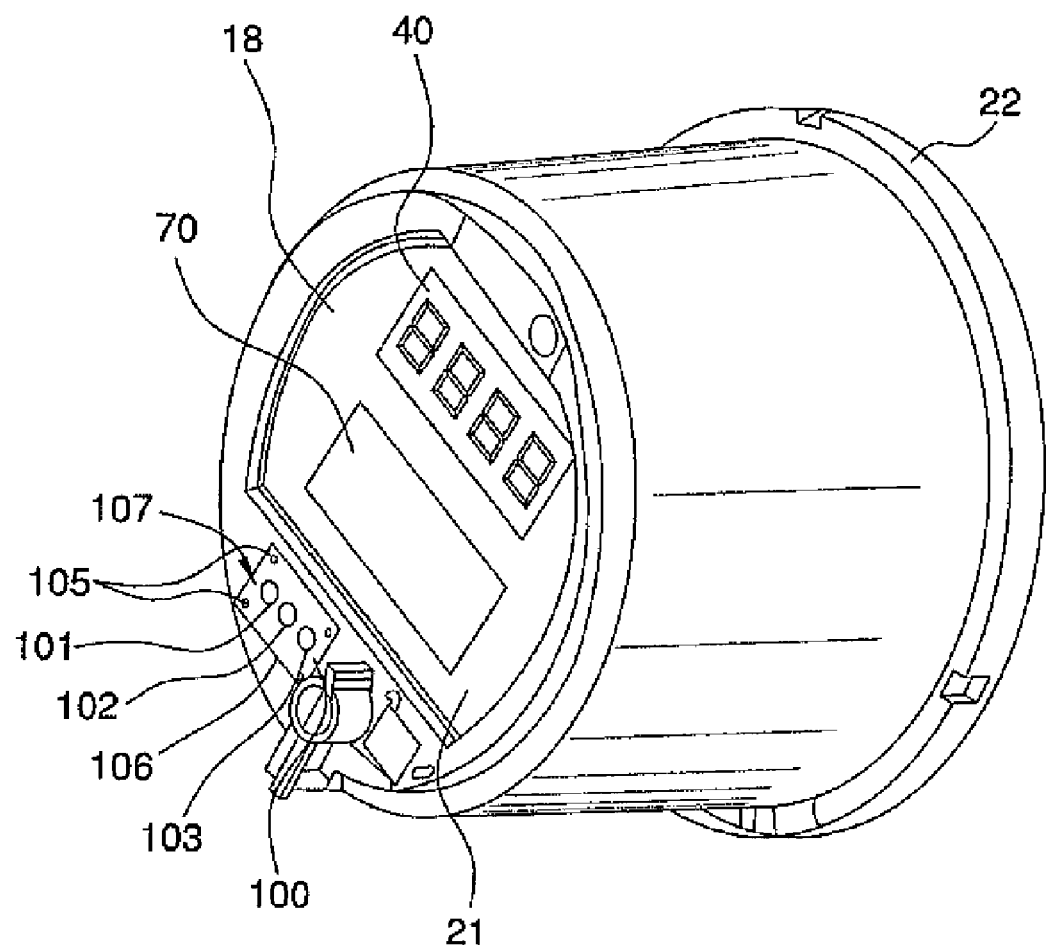
FIG. 3 is a top perspective view of a cover and inner cover for the electrical-energy meter shown in FIG. 1.

FIG. 3 depicts an example embodiment of a cover system of the electrical-energy meter 10. The cover system includes cover 20 and inner cover 18. Cover 20 covers inner cover 18. Inner cover 18, in turn, covers circuit board 38, etc., as shown in FIG. 1. Cover flange 22 may mate with the base 12 and, in conjunction with gasket 23, seal electrical-energy meter 10.

Optical port 100 and, more specifically, transmitters 101 and 103 and receiver 102, are viewed through holes in cover 20. Cover 20 also includes template fastening holes 105 used for attaching an optical template (not shown) to cover 20. In an alternative embodiment, deformable posts may be used instead of template fastening holes 105 such that holes in a template (not shown) may align with the deformable posts, and, when the template is placed on cover 20, the posts may be deformed by pressure from, for example, a hammer, such that the template is held in place. LCD 40, nameplate holder 70, a nameplate (not shown), and the remainder of inner cover front face 19 are viewed through transparent end 21 of cover 20. Additionally, cover 20 includes posts 106, 107 that protrude from the surface of cover 20. Posts 106, 107 are located to align with an optical probe that is configured to communicate with IEC devices. The posts help align the optical probe with optical port 100. These posts are not required by IEC, but they are commonly used.

Figure 4:
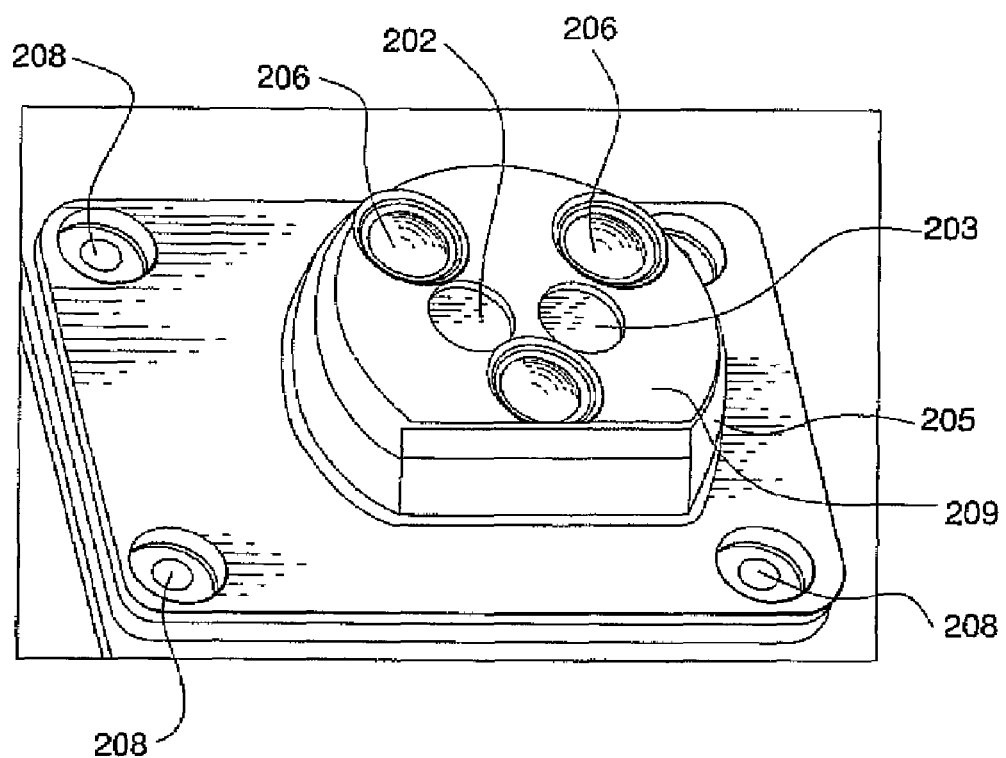
FIG. 4 is a top perspective view of an optical template compatible with external devices constructed in accordance with the American National Standards Institute (ANSI)

FIG. 4 depicts an example embodiment of an optical template 200 in accordance with the invention. When attached to electrical-energy meter 10, ANSI optical template 200 enables electrical-energy meter 10 to communicate with external devices constructed in accordance with ANSI. Optical template 200 includes a plate 205 with two through holes 202, 203 that align, respectively, with receiver 102 and transmitter 103 on optical port 100. Plate 205 can also include posts 206. The ends of posts 206 can be deformed to attach plate 205 to template 200. Optical template 200 may include an extended area 207 that physically covers transmitter 101, thereby inhibiting transmitter 101 from optically communicating with external devices. In other words, transmitter 103 and receiver 102 can communicate with external devices when optical template 200 is installed, while transmitter 101 cannot. Optical template 200 can also include attaching holes 208 that substantially align with template fastening holes 105 of cover 20 (see FIG. 3) for screwing or otherwise fastening optical template 200 to cover 20. It should be noted that a raised portion 209 of optical template 200 covers post 106 on cover 20 (see FIG. 3). The posts can be used to facilitate holding an IEC-compatible probe to the optical port and may be covered when configuring the optical port 100 for communication with an ANSI device. Likewise, a raised area 210 on the optical template 200 covers post 107 shown in FIG. 3. Optical template 200 is preferably constructed from ferromagnetic material so that an external device or probe containing a magnet can be more easily optically connected with ANSI optical template 200.

Figure 5:
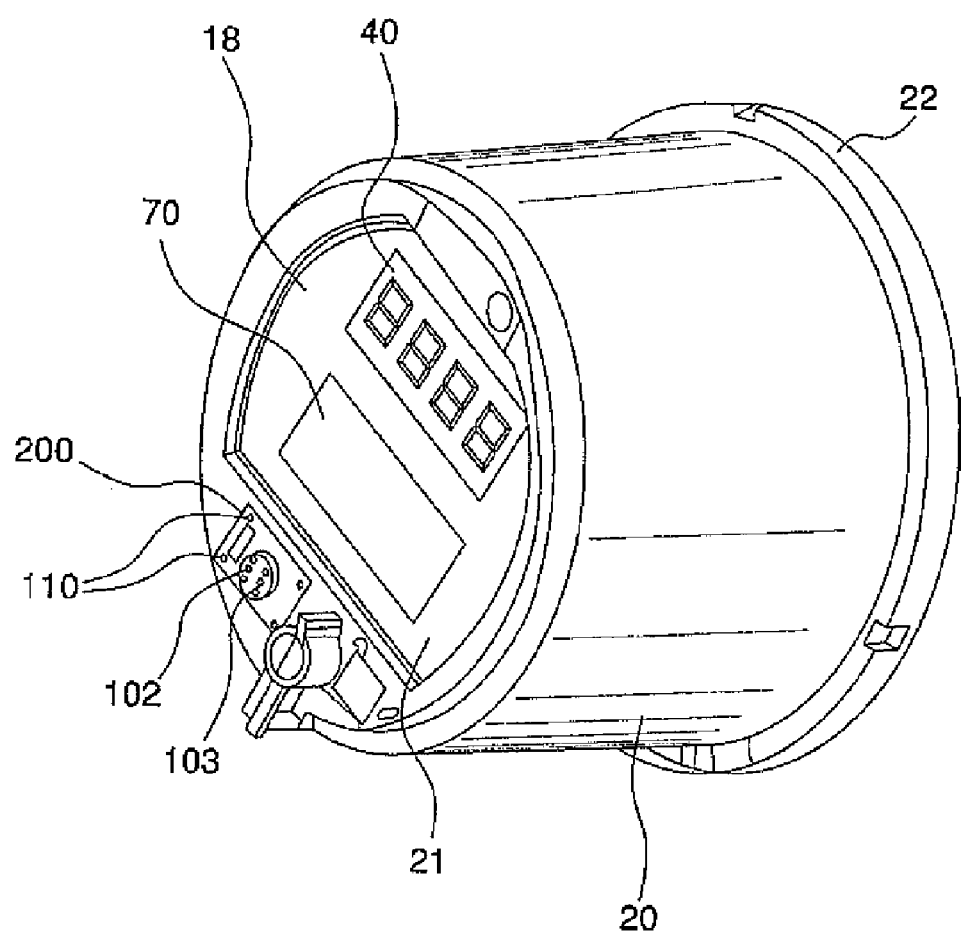
FIG. 5 is a top perspective view of the cover shown in FIG. 3 with the optical template shown in FIG. 4 attached to the cover.

FIG. 5 depicts an example embodiment of the electrical-energy meter's cover system configured to enable electrical-energy meter 10 to communicate with ANSI-compatible external devices (not shown). Optical template 200 is shown attached to optical port 100 (FIG. 3) using fasteners 110 through attaching holes 208. ANSI optical template 200 leaves exposed receiver 102 and transmitter 103, and physically covers transmitter 101 (FIG. 3).

Figure 6:
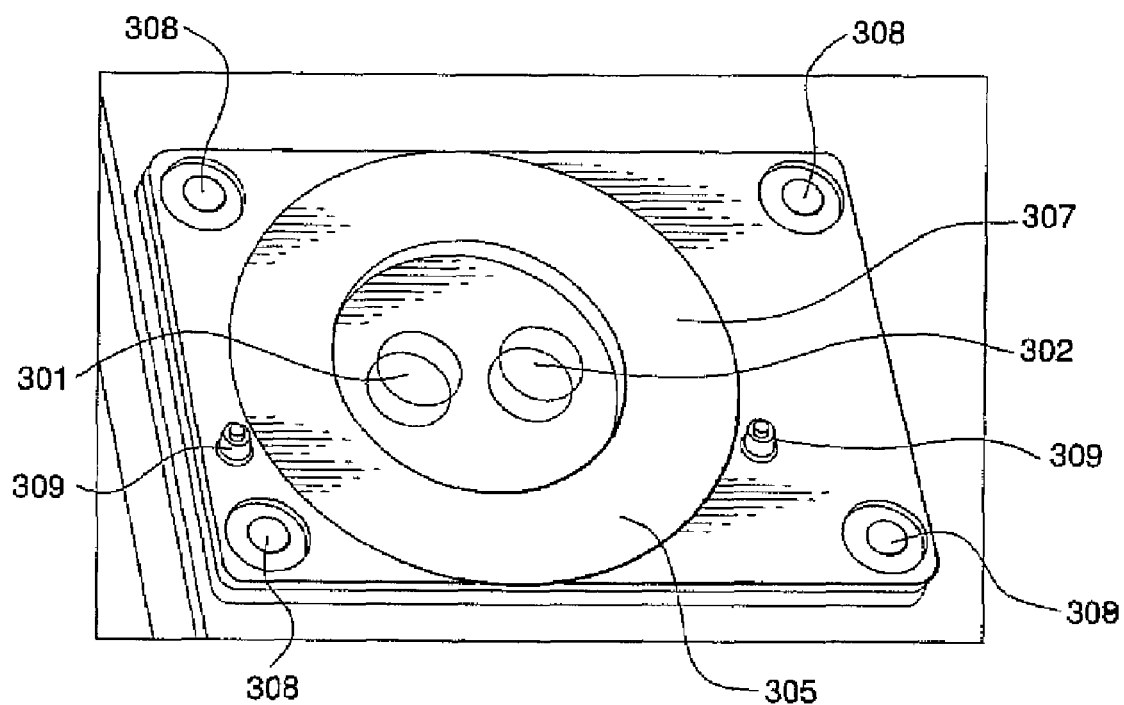
FIG. 6 is a top perspective view of an optical template compatible with external devices constructed in accordance with the International Electrotechnical Commission (IEC)

FIG. 6 depicts optical template 300. When attached to electrical-energy meter 10, optical template 300 enables electrical-energy meter 10 to communicate with external devices constructed in accordance with IEC. Optical template 300 includes a plate 305 with two holes 301, 302 that align, respectively, with transmitter 101 and receiver 102 on optical port 100. Optical template 300 includes an extended area 307 that physically covers and thereby inhibits transmitter 103 from optically communicating with external devices. Optical template may also include attaching holes 308 that substantially align with template fastening holes 105 of cover 20 for screwing or otherwise fastening optical template 300 to cover 20.

Optical template 300 may also include posts 309 for facilitating alignment of the external device with IEC optical template 300 during the connection of the external device to electrical-energy meter 10. In an alternative embodiment, optical template 300 may not have posts 309. Instead, posts 106 may be molded as part of cover 20 of meter 10. In the preferred embodiment of optical template 300, the template is constructed from ferromagnetic material so that an external device or probe (not shown) containing a magnet may be more easily optically connected to optical template 300.

Figure 7:
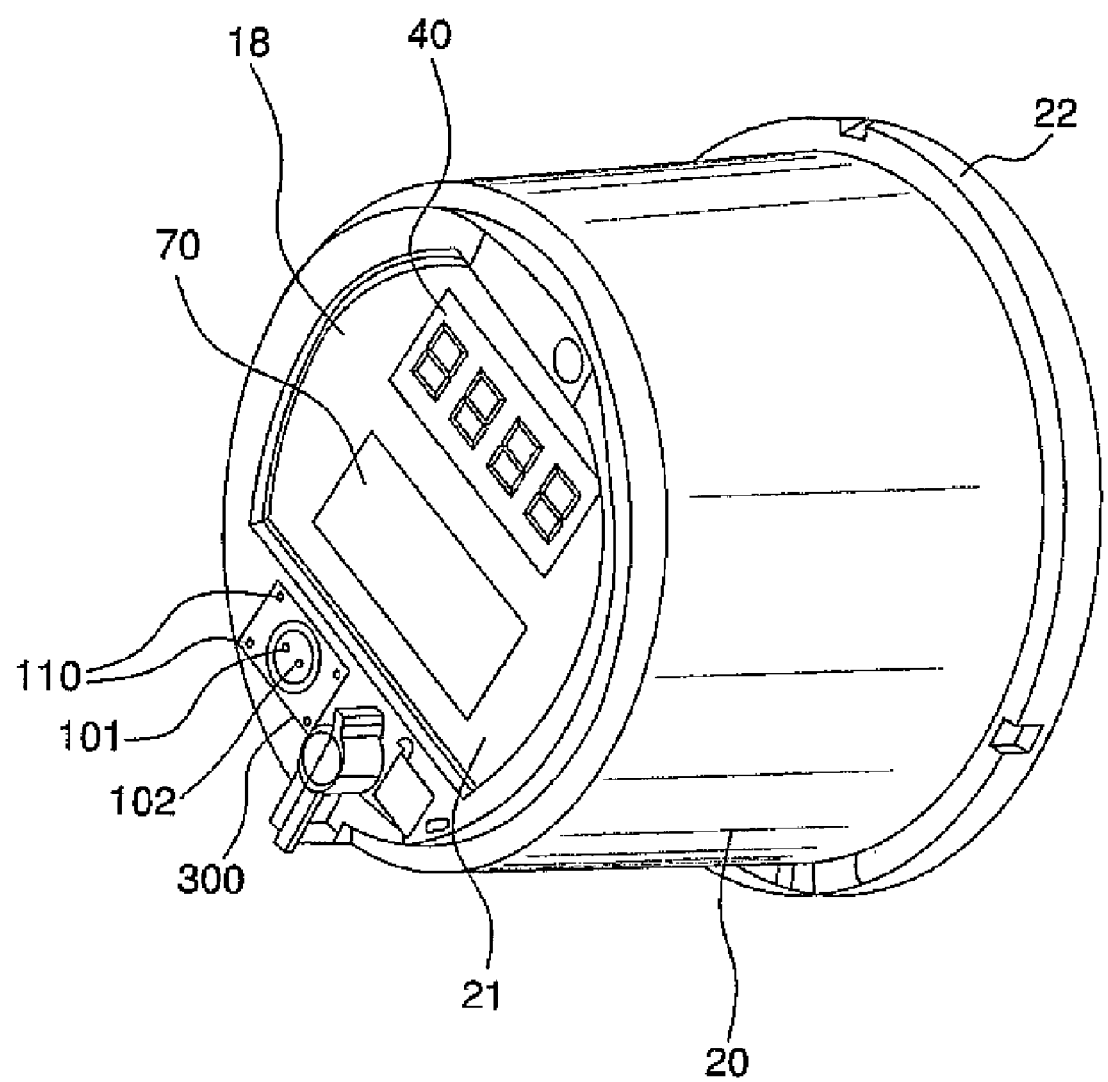
FIG. 7 is a top perspective view of the cover shown in FIG. 3 with the optical template shown in FIG. 6 attached to the cover.

FIG. 7 depicts the cover system configured to communicate with IEC-compatible external devices (not shown). FIG. 7 depicts the elements described in the description of the cover system as shown in FIG. 3 except that transmitter 103 is not shown. In addition to the elements shown in FIG. 3, FIG. 7 depicts optical template 300 attached to optical port 100 using fasteners 110. Optical template 300 physically covers transmitter 103 but not transmitter 101 or receiver 102. In other words, transmitter 101 and receiver 102 can communicate with external devices when the optical template 300 is installed, while transmitter 103 cannot.

The invention therefore may be an electrical-energy meter capable of communicating with external devices regardless of whether those external devices are constructed in accordance with the American National Standards Institute, the International Electrotechnical Commission, or other industry standards. The invention enables the distribution of electrical-energy meters to more markets without limitations based on the norms in those markets regarding the configuration of external devices with which the electrical-energy meter will communicate.

Figure 8:
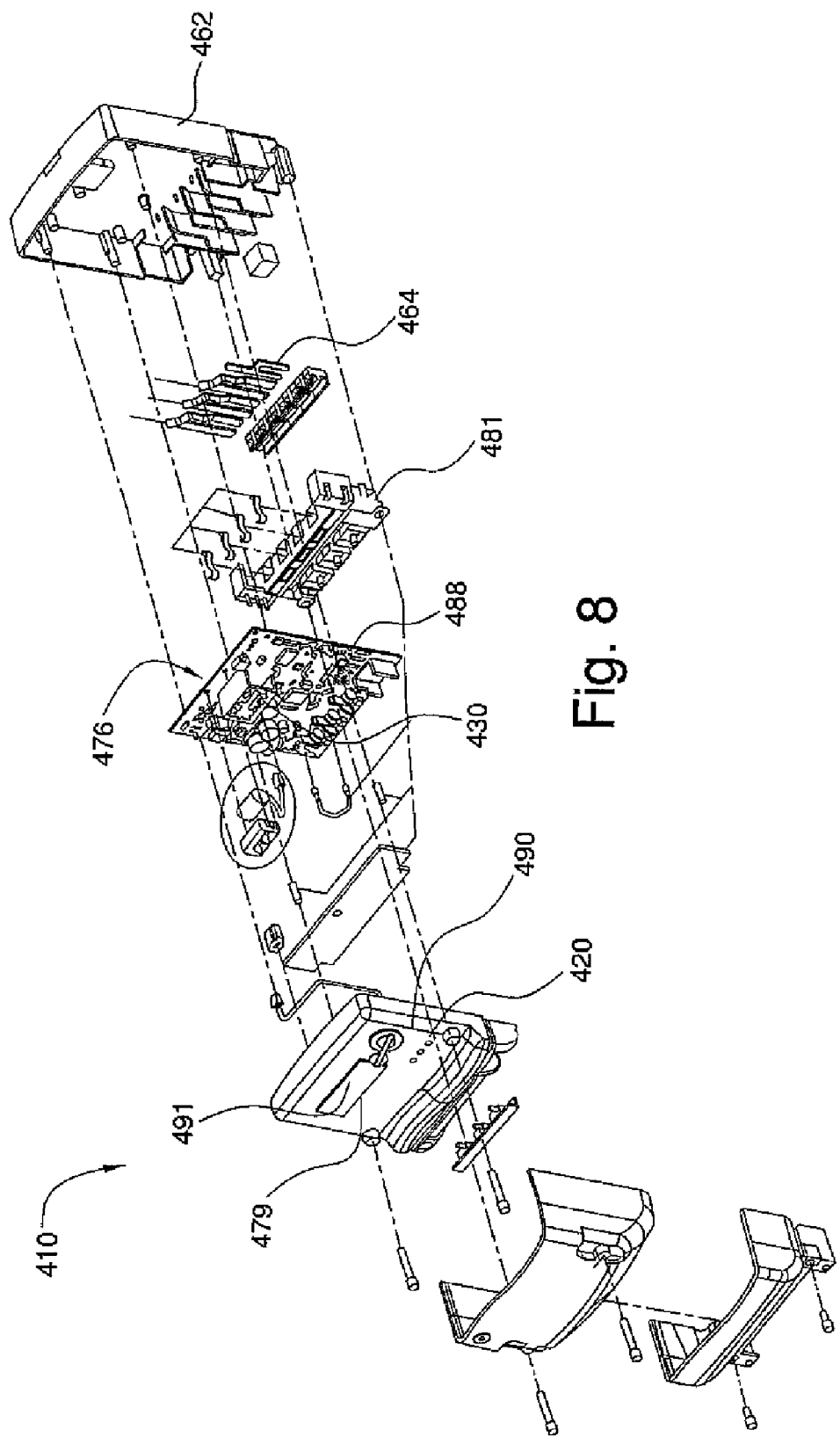
FIG. 8 is an exploded, top perspective view of an alternative embodiment of an electrical-energy meter.

FIG. 8 depicts an exploded view of an alternative embodiment of an electrical-energy meter 410. The electrical-energy meter 410 can be constructed in accordance with IEC. (The present invention may be applied to electrical-energy meters constructed in accordance with other industry standards as well, as discussed above.) Electrical energy meter 410 can include a base 462, a current bus 464, a current transformer 476, a circuit board 488, an optical port 420, and a cover 490.

Base 462 is preferably molded from a reinforced thermoplastic material having the requisite mechanical, electrical, and thermal properties, flammability rating, UV stabilization, and resistance to common solvents such as insecticides and cleaning solutions. An example of such thermoplastic material is polyketone, polycarbonate, or polybutylene terephthalate.

Current bus 464, a voltage spring housing 481, and the current transformer 476 can be mounted on base 462. In an alternative embodiment, the current transformer may be mounted to the circuit board. The circuit 488 board is electrically coupled to current transformer 476. Circuit board 488 also receives an input or line voltage, i.e., a voltage corresponding to the voltage in the electrical-energy line to which electrical-energy meter 410 is connected. Circuit board 488 is adapted to calculate the total (cumulative) watt-hours of energy that have passed through electrical-energy meter 410 over time based on the current and voltage input, using techniques and components commonly known to those skilled in the field of electrical-energy meter design. The cumulative watt-hours may be displayed on an LCD 430, which is mounted on circuit board 488.

Cover 490 is preferably molded from a reinforced thermoplastic material such as polyketone, polycarbonate, or polybutylene terephthalate and includes a substantially flat front face 479. Front face 479 includes LCD view hole 491 for viewing LCD 430. Further details relating to electrical-energy meter 410 (other than optical port 420 and cover 490) are not necessary for an understanding of the invention, and therefore are not presented herein.

Optical port 420 may be formed on front face 479 of cover 490 and may be coupled to circuit board 488 by way of optical fibers, or light pipes, or light tubes (not shown). Optical port 420 enables service personnel to read, test, and calibrate electrical-energy meter 410 without removing cover 490 and without exposing service personnel to high voltages within electrical-energy meter 410.

Figure 9:
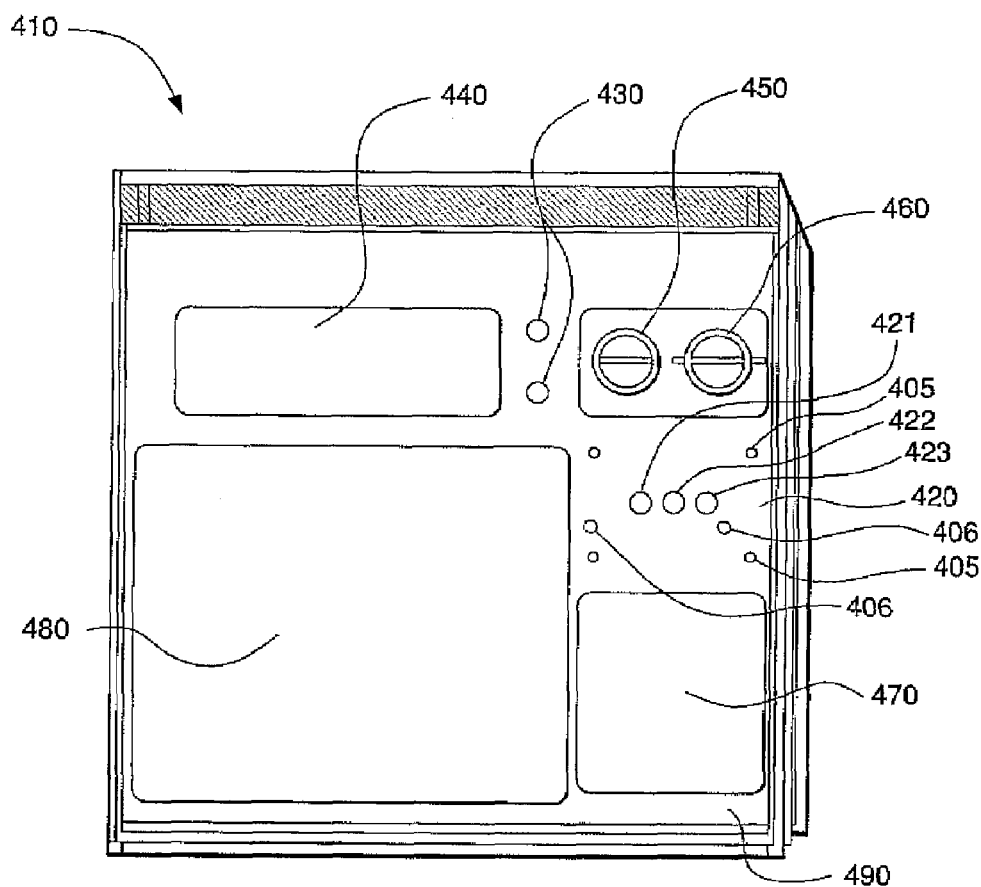
FIG. 9 is a front perspective view of the electrical-energy meter shown in FIG. 8.

FIG. 9 depicts a front view of electrical energy meter 410. An optical port 420 of electrical-energy meter 410 has a receiver 422 located in between transmitters 421 and 423. Additionally, optical port 420 may include deformable posts 405 used for attaching an optical template (not shown) to cover 490 of meter 410. The template can have holes that align with deformable posts 405, and, when the template is placed on cover 490, the posts may be deformed by pressure from, for example, a hammer, such that the template is held in place. In an alternative embodiment, template fastening holes may be used instead to hold template onto cover with screws or other fasteners. Optical port 420 may also have posts 406 that protrude from the surface of cover 490. Posts 406 can be located to align with an optical probe that is configured to communicate with IEC devices. The posts can help locate the optical probe with optical port 420. These posts are not required by IEC, but they are commonly used.

Light emitting diodes (LEDs) 430 located above and to the left of the optical port flash to convey information such as energy use in units of watts or volt-amperes reactive (VARs). A liquid crystal display (LCD) 440 is located to the left of LEDs 430 and conveys information regarding electrical-energy meter 410 such as the energy consumption of the consumer. A customer nameplate 470 can be located below optical port 420. A manufacturer nameplate 480 can be located to the right of optical port 420.

A push button 450 located to the right of LEDs 430 can enable a meter reader to cycle through various quantities on LCD 440 to view information about the electrical-energy meter (e.g. the energy consumption of the consumer). A demand reset button 460 located to the right of push button 450 enables the meter reader to reset electrical-energy meter 410. This reset is activated primarily for billing purposes. The reset button is more commonly used to reset the demand reading. Demand is the term for a measurement of an average maximum rate of energy consumption. It is a measure of power and is commonly expressed in kW. This reading is usually set to zero at the beginning of a billing period.

Figure 10:
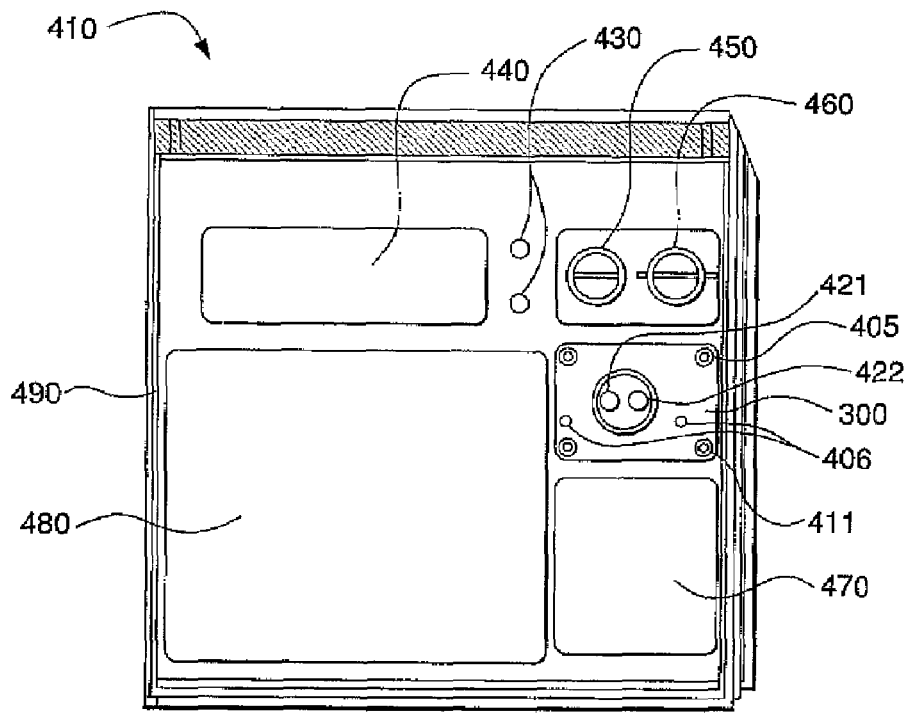
FIG. 10 is a front perspective view of the electrical-energy meter shown in FIG. 9 with the optical template shown in FIG. 6 attached.

FIG. 10 depicts electrical-energy meter 410 with a cover system configured to enable electrical-energy meter 410 to communicate with IEC-compatible external devices (not shown). The cover system includes cover 490 and optical template 300 as described above, in relation to electrical-energy meter 410. Optical template 300 is shown attached to cover 490 using deformable posts fasteners 405. Additionally, optical template 300 enables posts 406 to help align an external optical probe to optical template 300. Optical template 300 leaves exposed transmitter 421 and receiver 422 and physically covers and blocks transmitter 423.

Figure 11:
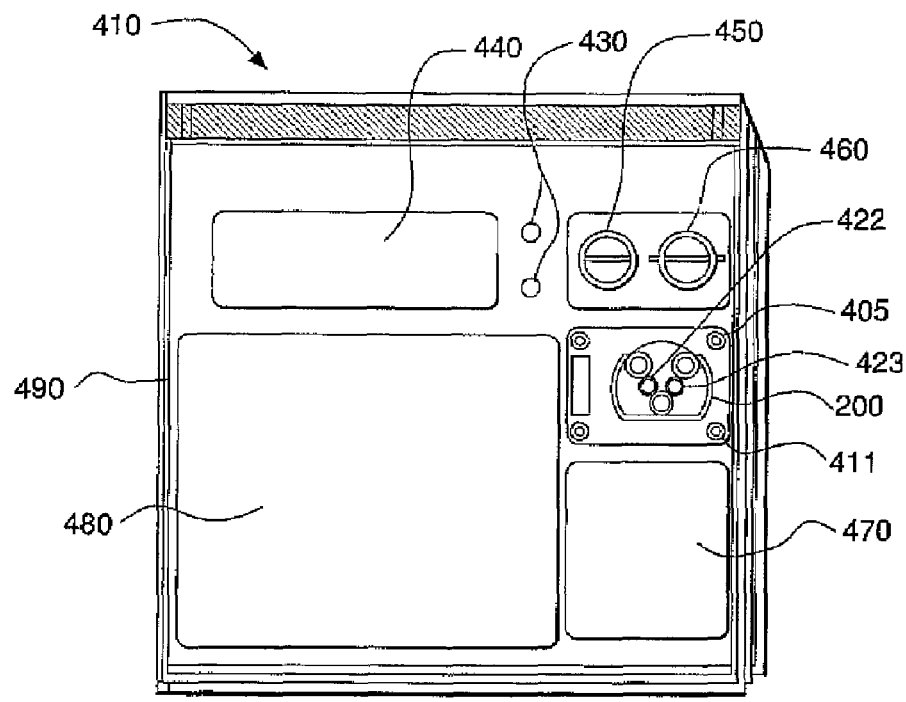
FIG. 11 is a front perspective view of the electrical-energy meter shown in FIG. 9 with the optical template shown in FIG. 4 attached.

FIG. 11 depicts the cover system configured to enable electrical-energy meter 410 to communicate with ANSI-compatible external devices (not shown). In addition to the elements of FIG. 9, ANSI optical template 200 is shown attached to electrical-energy meter 410 using deformable posts 405. ANSI optical template 200 leaves exposed receiver 422 and transmitter 423 and physically covers and blocks transmitter 421 (FIG. 9).

Figure 12:
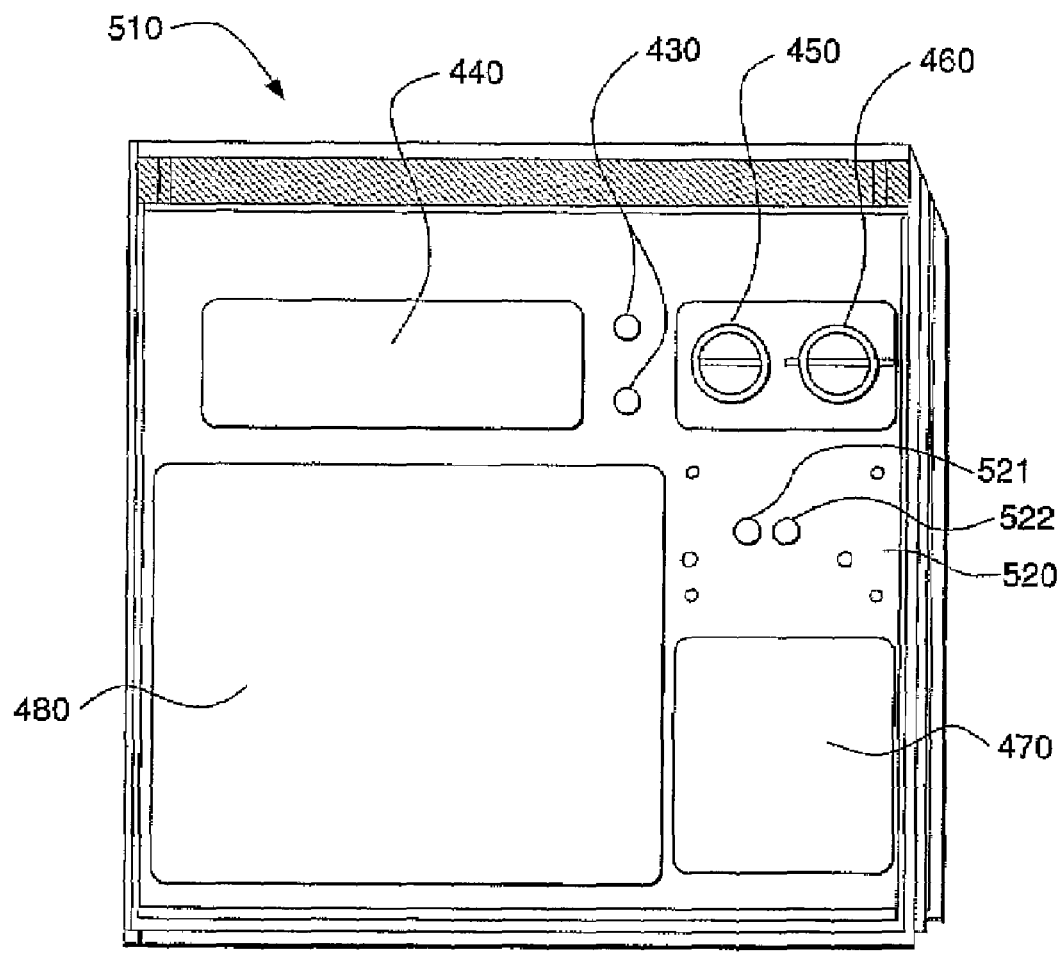
FIG. 12 is a front perspective view of an alternative example embodiment of an electrical-energy meter.

FIG. 12 depicts an alternative embodiment of the electrical-energy meter 10 in the form of an electrical-energy meter 510. Electrical-energy meter 510 includes a transmitter 521 and a receiver 522, but does not include a second transmitter. Electrical-energy meter 510 otherwise includes all of the elements as shown and described with regard to electrical-energy meter 410.

Figure 13:
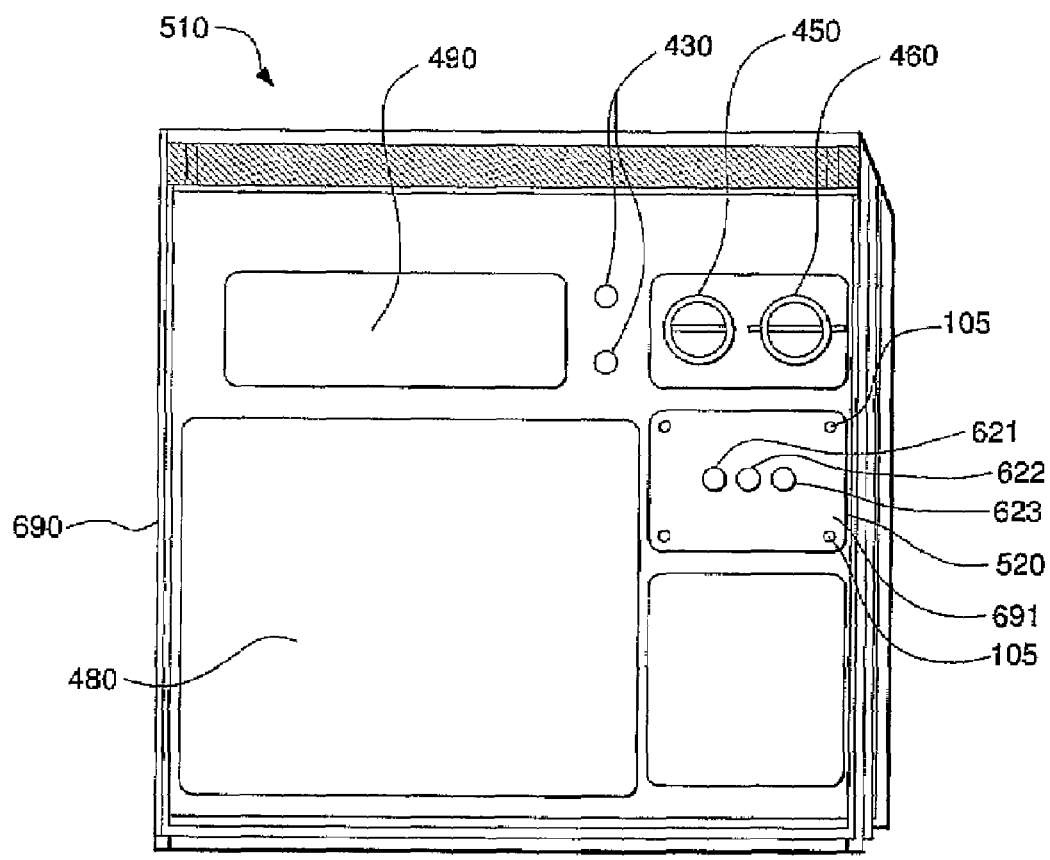
FIG. 13 is a front perspective view of the electrical-energy meter shown in FIG. 12 with a optical port cover that includes two optical conduits for carrying the signal of the electrical-energy meter's transmitter and an optical conduit substantially aligned with the electrical-energy meter's receiver.

FIG. 13 depicts an example embodiment of an optical port cover 691 for electrical-energy meter 510. Through optical port cover 691, electrical-energy meter 510 can be capable of being adapted to optically communicate with ANSI, IEC, or other types of external devices. Optical port cover 691 provides transmitter 521 (FIG. 12) two transmission signal outlets through transmission conduits 621 and 623, while continuing to provide access to receiver 522 (FIG. 12) through an optical conduit 622 substantially aligned with receiver 522 (FIG. 12). Optical port cover 691 may include template fastening holes 105 used for attaching an optical template (not shown) to optical port cover 691. Optical port cover 691 is preferably constructed of clear plastic.

Figure 14:
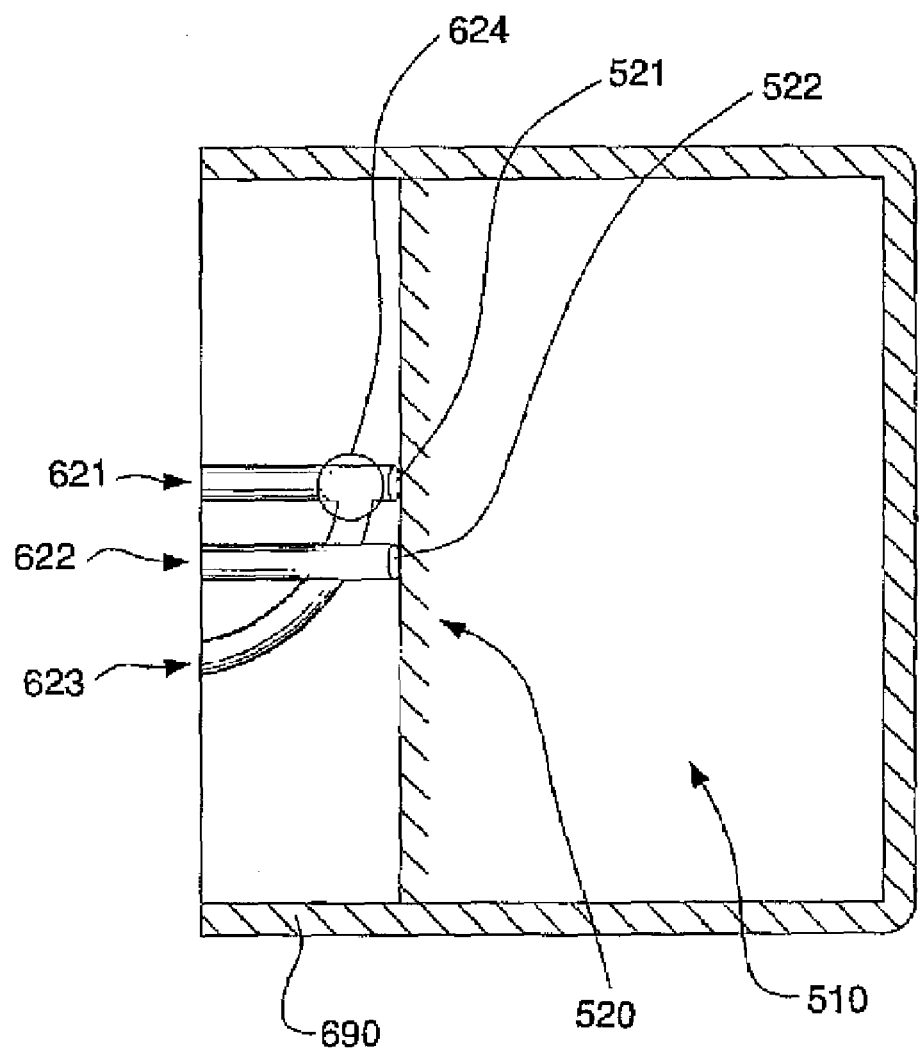
FIG. 14 is a top, partial cutaway view of the optical port of the electrical-energy meter and optical port cover shown in FIG. 13.

FIG. 14 is a top view of optical port cover 691 in the area of optical port 520 of electrical-energy meter 510. Optical port cover 691 includes an optical conduit 622 substantially aligned with receiver 522 of optical port 520 of electrical-energy meter 510. Optical port cover 691 also includes an optical conduit 621 substantially aligned with transmitter 521 of optical port 520 of electrical-energy meter 510. An optical conduit 623 may be coupled to optical conduit 621 through use of, for example, a fused biconic taper 624 of the type commonly known to those skilled in the art of designing or manufacturing fiber-optic cable systems. The use of fused biconic taper 624 is disclosed for exemplary purposes only. Other types of optical taps can be used to couple transmission conduits 621 and 623 in alternative embodiments. Optical conduits 621 and 623 carry or facilitate the transmission of signals from optical transmitter 521. Such optical conduits could be clear tubes or optical cables, for example. Optical templates such as optical template 200 (FIG. 4) or optical template 300 (FIG. 6), for example, can therefore be attached to optical port cover 691 and enable electrical-energy meter 510 to communicate, respectively, with external ANSI-compatible or IEC compatible devices.

It is to be understood that even though numerous characteristics of the present invention have been set forth in the foregoing description, the disclosure is illustrative only and changes may be made in detail within the principles of the invention to the full extent indicated by the broad general meaning of the terms in which appended claims are expressed. For example, the description illustrates electrical-energy meters configured to communicate with external devices compatible with ANSI or IEC but may also be configured to communicate with external devices compatible with other industry standards.

What is claimed:

1. An electrical-energy meter, comprising:
   a base for mounting the electrical-energy meter;
   a sensing device mechanically coupled to the base for producing an electrical output proportional to an electrical current in a conductor of electrical energy;
   a circuit board electrically coupled to the sensing device for calculating a cumulative amount of electrical energy passing through the conductor of electrical energy;
   a first and a second optical transmitter electrically coupled to the circuit board; and
   an optical receiver electrically coupled to the circuit board,
      wherein the first optical transmitter and the receiver convey information to and receive information from a first type of probe, and
      wherein the second optical transmitter and the receiver convey information to and receive information from a second type of probe.

2. The electrical-energy meter of claim 1, wherein the first type of probe conforms with a first industry standard.

3. The electrical-energy meter of claim 2, wherein the first industry standard is ANSI.

4. The electrical-energy meter of claim 1, wherein the second type of probe conforms with a second industry standard.

5. The electrical-energy meter of claim 4, wherein the second industry standard is IEC.

6. The electrical-energy meter of claim 1, further comprising:
   a cover adapted to receive at least one of a first template for configuring the electrical-energy meter to communicate with said first type of probe and a second template for configuring the electrical-energy meter to communicate with said second type of probe.

7. The electrical-energy meter of claim 6, wherein the first template comprises:
   a template base having a first and a second through hole,
   wherein the first through hole substantially aligns with the first optical transmitter of the electrical-energy meter and the second through hole substantially aligns with the electrical-energy meter's optical receiver when the template base is attached to the cover.

8. The electrical-energy meter of claim 7, wherein the template base covers the second optical transmitter.

9. The electrical-energy meter of claim 7, wherein the template facilitates communications between the electrical-energy meter and the first type of probe.

10. The electrical-energy meter of claim 6, wherein the second template comprises:
    a template base having a first and a second through hole,
    wherein the first through hole substantially aligns with the electrical-energy meter's optical receiver and the second through hole substantially aligns with the second optical transmitter of the electrical-energy meter when the template base is attached to the cover.

11. The electrical-energy meter of claim 10, wherein the template base covers the first optical transmitter.

12. The electrical-energy meter of claim 10, wherein the template facilitates communications between the electrical-energy meter and the second type of probe.

13. The electrical-energy meter of claim 10, wherein the template base is constructed of ferromagnetic material.

14. The electrical-energy meter of claim 1, wherein the optical receiver is located in between the first and second optical transmitters.

15. An electrical-energy meter, comprising:
    a base for mounting the electrical-energy meter;
    a sensing device mechanically coupled to the base for producing an electrical output proportional to an electrical current in a conductor of electrical energy;
    a circuit board electrically coupled to the sensing device for calculating and displaying a cumulative amount of electrical energy passing through the conductor of electrical energy;
    a first and a second optical receiver electrically coupled to the circuit board; and
    an optical transmitter electrically coupled to the circuit board,
       wherein the first optical receiver and the transmitter receive information from and convey information to a first type of probe, and
       wherein the second optical receiver and the transmitter receive information from and convey information to a second type of probe.

* * * * *